United States Patent [19]
Nagase et al.

[11] Patent Number: 5,874,861
[45] Date of Patent: Feb. 23, 1999

[54] AMPLIFIER CIRCUIT

[75] Inventors: Norio Nagase, Yokohama; Daisuke Yamazaki, Kawasaki, both of Japan

[73] Assignee: Fujitsu Limited, Kawasaki, Japan

[21] Appl. No.: 773,044

[22] Filed: Dec. 24, 1996

[30] Foreign Application Priority Data

Dec. 28, 1995 [JP] Japan ................................. 7-343927

[51] Int. Cl.⁶ .................................................. H03F 3/08
[52] U.S. Cl. ............................... 330/308; 250/214 A
[58] Field of Search ............................... 330/282, 292, 330/293, 308, 284; 250/214 A

[56] References Cited

U.S. PATENT DOCUMENTS 5,606,282  2/1997  Yashida ............................... 330/308 X

*Primary Examiner*—Steven Mottola
*Attorney, Agent, or Firm*—Staas & Halsey

[57] ABSTRACT

An amplifier circuit includes an amplifier which derives an output voltage from an input current, and a bypass circuit which bypasses part of the input current so that the remainder of the input current is applied to the amplifier.

11 Claims, 11 Drawing Sheets

$V_{3BE} = V_{3BE0} + (I_{IN} - I_{3C})Z_{TRAN}$

AMPLIFIER CIRCUIT

BACKGROUND OF THE INVENTION

1. Field of the Invention

The present invention generally relates to an optical communication system, and more particularly to an amplifier circuit suitably used to amplify an input current obtained by converting a light signal.

In an optical communication system, information is transmitted by light, while in many cases the necessary amplifying and switching is performed by amplifying and switching an electric signal. For example, a light signal transmitted over an optical fiber cable is converted into an electric signal by means of a photodiode. The electric signal is then amplified and is subjected to a predetermined process. The amplifying of the electric signal is carried out by a first amplifier circuit (preamplifier) that converts a current signal output by the photodiode into a voltage signal, and a second amplifier circuit (main amplifier circuit) that amplifies the voltage signal.

The present invention relates to an amplifier circuit which converts a current signal into a voltage signal in an optical communication system.

2. Description of the Related Art

Generally, each subscriber terminal is connected to a switching office by an optical fiber cable. In the switching office, a received light signal is converted into an electric signal, which is then subjected to a predetermined signal process. The light signal transmitted over the optical fiber and received at the switching office has a variation in the receive level. Such a variation in the receive level is due to, for example, the distance between the switching office and each subscriber terminal or the differences among the output levels of the light signals transmitted from the subscriber terminals. When the levels of the received light signals are varied, current signals obtained by converting the received light signals are correspondingly varied. A preamplifier circuit, which converts the current signal (input current) into a voltage signal (output voltage), has a certain tolerance of variation in the input current. However, if there is a large variation in the level of the received light signal, the preamplifier will be saturated and the duty ratio of the output voltage will become different from that of the input signal. This will cause an error in a subsequent signal process carried out at a following stage, such as a decision-making process (discrimination process).

FIG. 1 is a circuit diagram of a conventional preamplifier circuit, which is made up of bipolar transistors $Q_1$ and $Q_2$, a load resistor RL, a feedback resistor Rf and an output resistor R. The load resistor RL has an end connected to a constant-voltage source $V_{CONT}$. A photodiode PD having a cathode connected to another constant-voltage source $V_{CONT}$ converts the light input into a current input. Since the transistor $Q_1$ has a high base impedance, most of the input current passes through the feedback resistor Rf and flows to ground through the output resistor R. Hence, the emitter potential of the output transistor (which may be called a buffer transistor) $Q_2$ is decreased. When no light input is received, no current flows in the feedback resistor Rf. Hence, the emitter potential of the transistor $Q_2$ is increased.

However, the preamplifier shown in FIG. 1 has the following disadvantages, which will be described with reference to FIG. 2. FIG. 2 shows a dc input/output response characteristic of the preamplifier shown in FIG. 1. As shown in FIG. 2, if the input current has an excessive amplitude waveform with respect to the input/output characteristic (in other words, if a large current input takes place), the collector potential of the transistor Q1 shown in FIG. 1 is decreased, and a sufficient base-collector voltage cannot be obtained. Hence, the circuit is saturated. Thus, as shown in FIG. 2, the duty ratio of the output voltage waveform (output response waveform) is degraded. A degradation of the above duty ratio may cause an erroneous decision operation for each bit in a decision making circuit coupled to the preamplifier through the main amplifier. The decision making circuit determines, for each bit, whether the signal is either "0" or "1".

SUMMARY OF THE INVENTION

It is a general object of the present invention to provide an amplifier circuit in which the above disadvantages are eliminated.

A more specific object of the present invention is to provide an amplifier circuit in which the circuit is not saturated even if an excessive input current is applied and a decreased degradation of the duty ratio of the output voltage can be obtained.

The above objects of the present invention are achieved by an amplifier circuit comprising: an amplifier which derives an output voltage from an input current; and a bypass circuit which bypasses part of the input current so that the remainder of the input current is applied to the amplifier. The above bypass circuit corresponds to, for example, a bypass circuit 12 shown in FIG. 3.

The bypass circuit may comprise means for determining, based on the output voltage, a ratio of a bypass current which corresponds to the part of the input current to the input current.

The bypass circuit may comprise first and second transistors (which correspond to, for example, transistors $Q_4$ and $Q_3$, respectively, employed in an embodiment of the present invention). The first transistor may have a first terminal connected to a first constant-voltage source (which corresponds to, for example, a constant-voltage source $V_{CONT1}$), a second terminal connected to a first resistor (which corresponds to, for example, a resistor R4), and a control terminal connected to an output terminal of the amplifier. The second transistor may have a first terminal connected to an input terminal of the amplifier, a second terminal connected to the first resistor, and a control terminal connected to a second constant-voltage source (which corresponds to, for example, a constant-voltage source $V_{CONT2}$).

The bypass circuit may comprise first and second transistors (which correspond to, for example, transistors $Q_4$ and $Q_3$, respectively, employed in an embodiment of the present invention). The first transistor may have a first terminal connected to a first constant-voltage source (which corresponds to, for example, a constant-voltage source $V_{CONT1}$), a second terminal connected to a first constant-current source (which corresponds to, for example, a constant-current source $I_{CONT}$), and a control terminal connected to an output terminal of the amplifier. The second transistor may have a first terminal connected to an input terminal of the amplifier, a second terminal connected to the first constant-current source, and a control terminal connected to a second constant-voltage terminal (which corresponds to, for example, a constant-voltage source $V_{CONT2}$)

The amplifier circuit may comprise a series circuit having a plurality of resistors (R6 and R7) connected in series between an output terminal of the amplifier and a reference potential point. The amplifier circuit has a feedback resistor Rf connected between an input terminal of the amplifier circuit and a node within the series circuit.

The amplifier circuit may comprise a compensating circuit which varies a characteristic of the amplifier on the basis of an amount of the input current. The above compensating circuit corresponds to a circuit comprised of a transistor $Q_5$ and a constant-voltage source $V_{CONT3}$ shown in FIG. 5 or a circuit comprised of transistors $Q_5$ and $Q_6$ and resistors R1, R2 and R5 shown in FIG. 10.

The above compensating circuit may comprise a circuit which varies a load resistance of a transistor provided in the amplifier on the basis of an amount of the input current.

The compensating circuit may comprise a third transistor ($Q_6$) coupled to a load resistance of a transistor provided in the amplifier in parallel through a second resistor (R5), and a fourth transistor ($Q_5$) connected to the load resistance in parallel. The third and fourth transistors are turned ON at different base potentials.

The amplifier circuit may further comprise constant-voltage sources ($V_{CONT3}$, $V_{CONT4}$) generating different constant voltages, the third and fourth transistors respectively having bases to which the constant-voltage sources are respectively connected.

The fourth transistor may have a base connected to a third constant-voltage source ($V_{CONT5}$); and the third transistor has a base coupled to the third constant-voltage source via a third resistor (R2). The third resistor may have a base coupled to the fourth constant-voltage source via a fourth resistor (R1).

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

Figure 3:
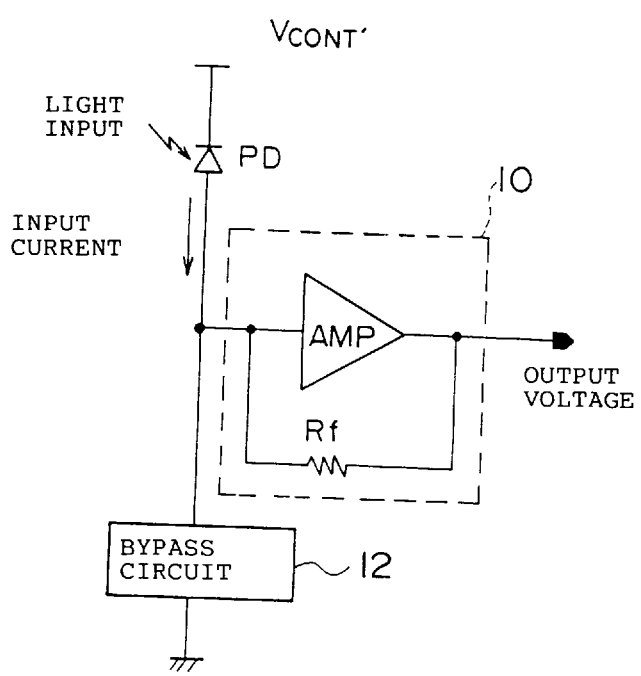
FIG. 3 is a circuit diagram showing the principle of the present invention.

FIG. 3 is a circuit diagram showing the principle of the present invention. A preamplifier (which may simply be referred to as amplifier in the following description) shown in FIG. 3 has a feature in which a bypass circuit 12 is provided between an input terminal of an amplifier 10 and ground. The ground serves as a reference potential point. The preamplifier 10 includes the transistors $Q_1$ and $Q_2$, the load resistor RL and the output resistor R shown in FIG. 1. The bypass circuit 12 bypasses part of the input current from the photodiode PD as a bypass current before the input current is input to the preamplifier 10. More particularly, the bypass circuit 12 allows the bypass current to flow therein at a given ratio of the bypass current to the input current when the input current has a magnitude equal to or greater than a predetermined value. The ratio of the bypass current to the input current can be determined based on the output voltage of the preamplifier 10.

If an excessive input current which saturates the amplifying operation of the preamplifier 10 flows from the photodiode PD, the bypass circuit 12 starts to operate. Then, the bypass circuit 12 applies a suitable amount of current to the preamplifier 10, and allows the remaining current to flow therein as the bypass current. Hence, it is possible to eliminate the aforementioned problems, more particularly, a saturation of the circuit and a degradation of the duty ratio of the output voltage.

Figure 4:
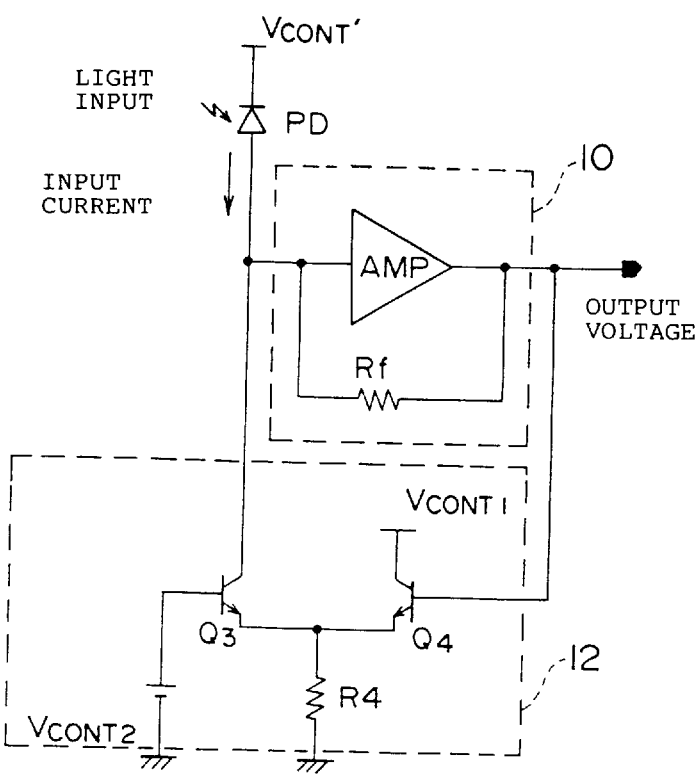
FIG. 4 is a circuit diagram of a structure of a bypass circuit shown in FIG. 3.

FIG. 4 is a circuit diagram of an amplifier circuit having a structure of the bypass circuit 12 shown in FIG. 3. The bypass circuit 12 shown in FIG. 4 includes two transistors $Q_3$ and $Q_4$, a resistor R4, and a constant-voltage source $V_{CONT2}$. The of the transistor $Q_3$ is connected to the input terminal of the preamplifier 10, and the emitter thereof is connected to an end of the resistor R4. The base of the transistor Q3 is connected to the constant-voltage source $V_{CONT2}$. The collector of the transistor $Q_4$ is connected to the constant-voltage source $V_{CONT1}$, and the emitter thereof is connected to the above (i.e. 1 upper) end of the resistor R4. The base of the transistor $Q_4$ is connected to the output terminal.

The constant-voltage source $V_{CONT1}$ may generate a voltage equal to or different from that of the constant-voltage source $V_{CONT}$ to which the photodiode PD is connected. The constant-voltage source $V_{CONT2}$ generates a voltage which sets the base-emitter voltage of the transistor $Q_3$ equal to 0.4V in a state in which there is no input current. Normally, the bipolar transistors have a base-emitter voltage of approximately 0.8V.

When the input current starts to flow from the photodiode PD, it flows in the feedback resistor Rf, and the potential of the output terminal of the preamplifier 10, that is, the output voltage starts to be decreased. At that time, the base-emitter voltage of the transistor $Q_3$ is lower than 0.8V, and thus no current flows in the transistor $Q_3$.

As the input current gradually increases, the output voltage is decreased, and the emitter potential of the transistor. $Q_4$ is decreased. When the output voltage is decreased by 0.4V, the emitter voltage of the transistor $Q_4$ is also decreased by 0.4V. Hence, the base-emitter voltage of the transistor $Q_3$ becomes equal to 0.8V, so that the transistor $Q_3$ is turned ON from OFF. Hence, the bypass circuit 12 is turned ON (starts to operate), and part of the input current starts to flow in the transistor $Q_3$. Even if the input current is further increased, the excessive current is caused to flow in the bypass circuit 12, and the output voltage is fixed to the voltage which is 0.4V lower than the original output voltage.

Figure 1:
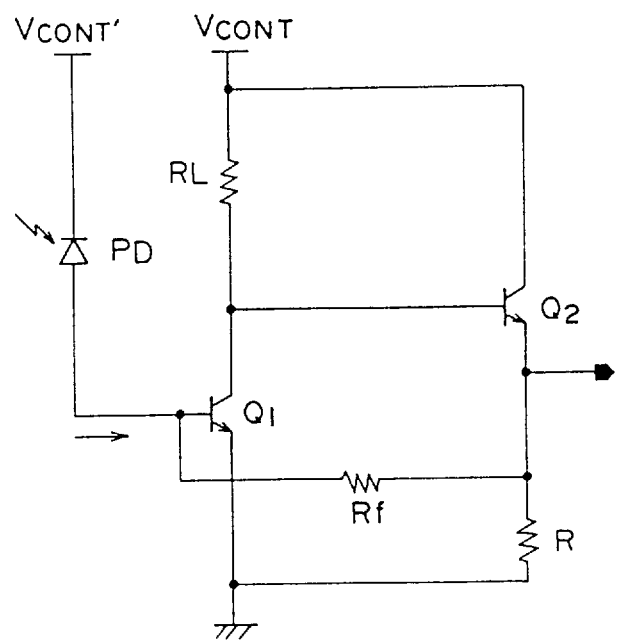
FIG. 1 is a circuit diagram of a conventional preamplifier.
Figure 2:
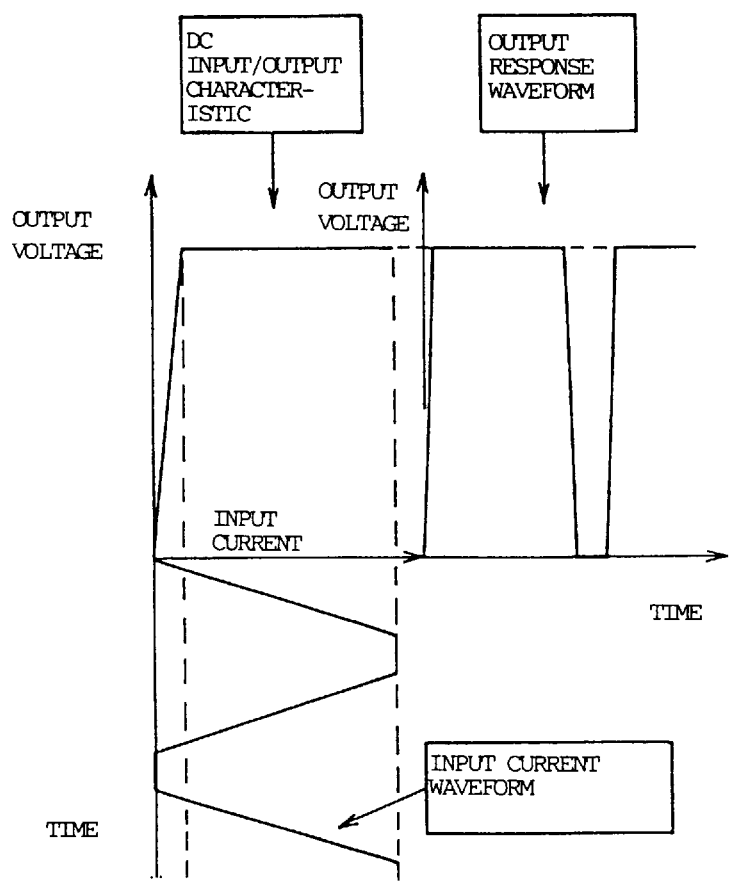
FIG. 2 is a graph of a dc input/output response characteristic of the preamplifier shown in FIG. 1.

In the aforementioned amplifier circuit shown in FIG. 1, if a large input current which is excessive in terms of the input/output response of the amplifier circuit flows from the photodiode PD, the preamplifier is saturated soon, as shown in FIG. 2. On the other hand, with the structure shown in FIG. 4, it is possible to bypass part of the input current through the bypass circuit 12 so that an appropriate amount of current is always applied to the preamplifier 10. Hence, the circuit shown in FIG. 4 does not have any problem as has been described with reference to FIG. 2.

Now, the operation of the amplifier shown in FIG. 4 will be expressed by using mathematical expressions. An amplifier AMP of the preamplifier 10 shown in FIG. 4 includes transistors $Q_1$, $Q_2$ and $Q_5$, the load resistor RL, the feedback resistor Rf, the output resistor R and a constant-voltage source $V_{CONT3}$ shown in FIG. 5. The transistor $Q_5$ will be described later.

As has been described previously, the base potential of the transistor $Q_4$ is decreased when the current input occurs. Hence, the current flowing in the transistor $Q_4$ is decreased, and the emitter potential of the transistor $Q_3$ is decreased. If the base potential of the transistor $Q_3$ is set higher than a threshold voltage $V_T$ (=kT/q) beforehand, the base-emitter voltage $V_{BE}$ of the transistor $Q_3$ is increased. That is, the input current can be bypassed based on the amount of the input current.

A description will now be given of the current bypassing operation. The following symbols are defined as follows:

$I_{IN}$: input current
$I_{3C}$: collector current (bypass current) of transistor $Q_3$
$V_{3BE0}$: base-emitter voltage of transistor $Q_3$ when there is no current input
$Z_{TRAN}$: transimpedance obtained when viewing the preamplifier 10 from the input terminal thereof to the output terminal thereof when there is no bypass current
$I_S$: saturation current of transistor The base-emitter voltage $V_{3BE}$ of the transistor $Q_3$ is written as follows:

$$V_{3BE}=V_{3BE0}+(I_{IN}-I_{3C})Z_{TRAN} \quad (1)$$

Hence, the bypass current $I_{3C}$ is written as follows:

$$\begin{aligned}I_{3C} &= I_S \cdot \exp(V_{3BE}/V_T) \\ &= I_S \cdot \exp\{(V_{3BE0} + (I_{IN} - I_{3C})Z_{TRAN})/V_T\}\end{aligned} \quad (2)$$

From equation (2), the following is obtained:

$$I_{IN}=V_T/Z_{TRAN}\ln(I_{3C}/I_S)+I_{3C}-(V_{3BE0}/Z_{TRAN}) \quad (3)$$

It can be seen from the above that the bypass current is increased as the input current $I_{IN}$ is increased.

When the differential transimpedance obtained when the input current $I_{IN}$ is bypassed is denoted as $Z_{TRAN'}$, the following expression can be obtained:

$$(\partial I_{IN}-\partial I_{3C})Z_{TRAN}=\partial I_{IN}\cdot Z_{TRAN'} \quad (4)$$

Then, the differential transimpedance $Z_{TRAN'}$ is obtained as follows:

$$Z_{TRAN'}=(1-(\partial I_{3C}/\partial I_{IN}))Z_{TRAN}=(1-(1/(\partial I_{IN}/\partial I_{3C})))Z_{TRAN} \quad (5)$$

Hence, from equations (3) and (5), the differential transimpedance $Z_{TRAN'}$ can be rewritten as follows:

$$Z_{TRAN40}=(1-(1/((V_T/Z_{TRAN}I_{3C})+1)))Z_{TRAN}=(V_TZ_{TRAN})/(V_T+Z_{TRAN}I_{3C}) \quad (6)$$

It can be seen from the above that the differential transimpedance $Z_{TRAN'}$ depends on the amount of the bypass current. That is, the transimpedance $Z_{TRAN'}$ is gradually decreased with respect to the input current. It is to be noted that in the conventional preamplifier the transimpedance is greatly decreased due to the saturation. Hence, as compared with the conventional preamplifier, the circuit shown in FIG. 5 can achieve a small degradation of the duty ratio.

Generally, the high-band cutoff frequency $f_{-3dB}$ of the preamplifier can be written as follows:

$$f_{-3dB}=(gm\cdot(RL'))/(2\pi\cdot C_{IN}\cdot Z_{TRAN'}) \quad (7)$$

where symbols $C_{IN}$, gm and RL' denote the following:

$C_{IN}$: input capacitance
gm: transfer conductance of transistor
RL': differential load resistance Hence, if the differential transimpedance $Z_{TRAN'}$ is decreased with RL' being constant, the high-band cutoff frequency $f_{-3dB}$ becomes too high to obtain a sufficient phase margin of the loop made up of the transistors $Q_1$ and $Q_2$ and the feedback resistor Rf. That is, the circuit is liable to oscillate.

Figure 5:
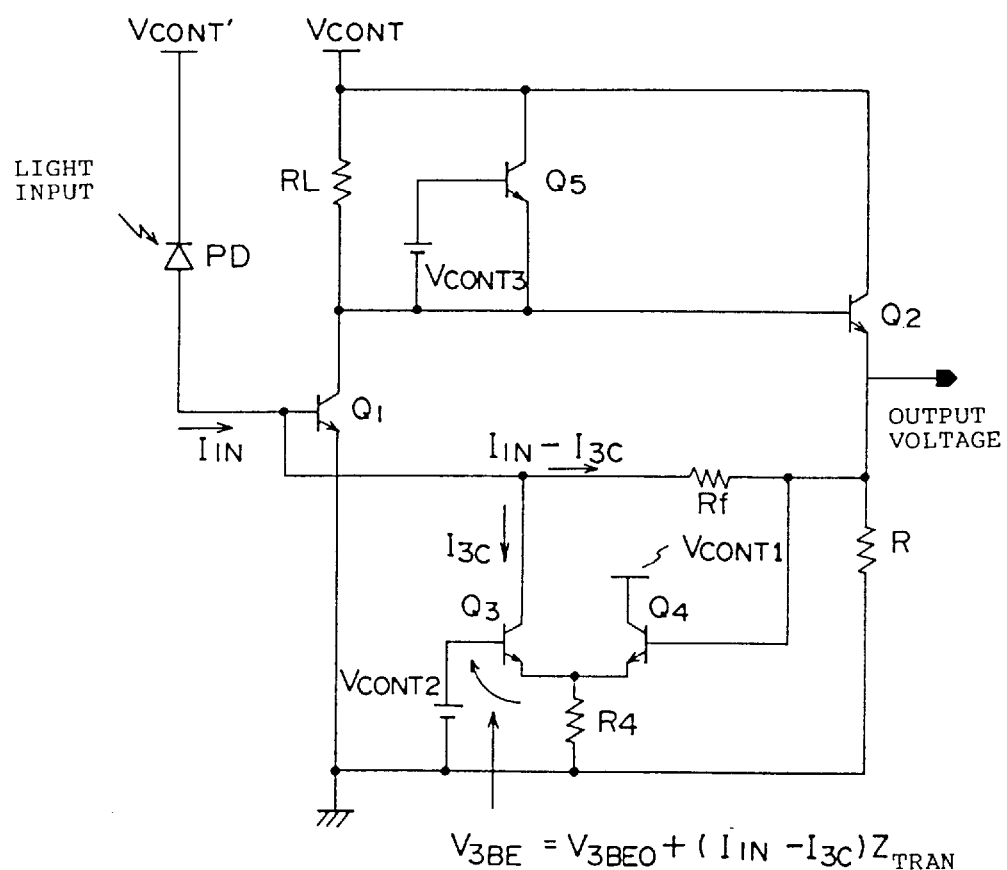
FIG. 5 is a circuit diagram of the structure shown in FIG.4.

With the above in mind, the circuit shown in FIG. 5 is provided with the transistor $Q_5$, which is turned ON from OFF at the same time that the transistor $Q_3$ is turned ON from OFF, so that the differential load resistance RL' can be decreased at the same time that the differential transimpedance $Z_{TRAN'}$ is decreased. Hence, it is possible to maintain the high-band cutoff frequency $f_{-3dB}$ at a constant level and to thereby ensure a sufficient phase margin. From this viewpoint, the transistor $Q_5$ can be referred to as a phase compensating circuit or simply compensating circuit.

As described above, it is preferable to provide the above compensating circuit in the preamplifier 10.

Figure 6:
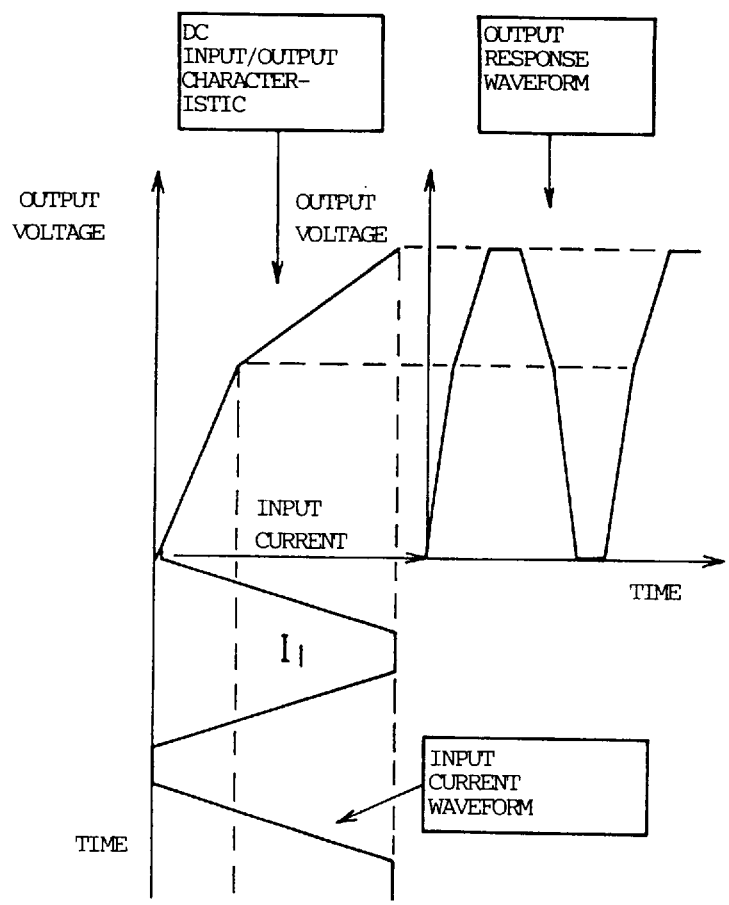
FIG. 6 is a graph of an input/output response characteristic of the amplifier shown in FIG. 5.

FIG. 6 is a graph of an input/output response characteristic of the amplifier circuit shown in FIG. 5. When the input current $I_{IN}$ reaches $I_1$, the transistor $Q_3$ is turned ON, and the bypass current starts to flow. At that timing, the transistor $Q_5$ is turned ON, and the differential load resistance RL' is decreased. Thus, an increase in the output voltage with respect to an increase in the input current is suppressed, and the output voltage has a waveform as shown in FIG. 6. It can be seen from FIG. 6 that the circuit shown in FIG. 5 is not saturated even if an excessive input current is applied and a degradation of the duty ratio of the output voltage can be suppressed.

Figure 7:
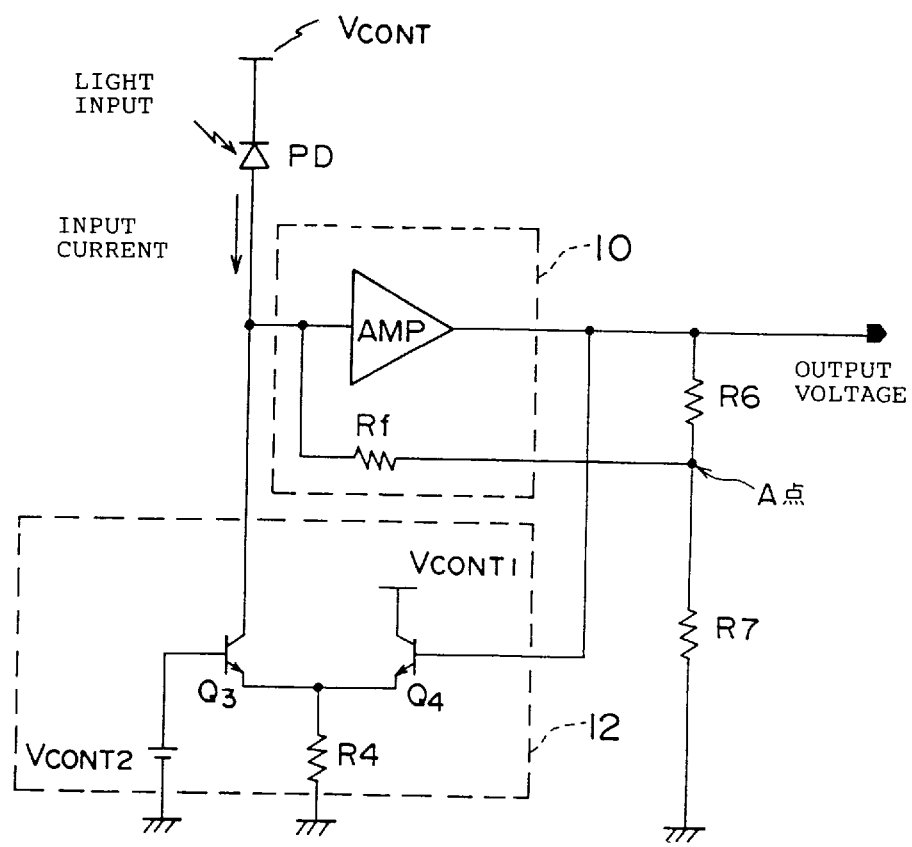
FIG. 7 is a circuit diagram of a variation of the configuration in FIG. 4.

FIG. 7 is a circuit diagram of a variation of the circuit configuration shown in FIG. 4. As has been described previously, one end of the feedback resistor Rf shown in FIG. 4 is connected to the output terminal of the preamplifier 10. In the circuit shown in FIG. 7, one end of the feedback resistor Rf is connected to a connection node A at which resistors R6 and R7 are connected in series. A series circuit made up of the resistors R6 and R7 is connected between the output terminal of the preamplifier 10 and the ground, and functions to easily set the base potential of the transistor $Q_4$. In other words, the series circuit functions to easily determine the timing at which the bypass current starts to flow.

More particularly, the base potential of the transistor $Q_4$ depends on the ratio of the resistance values of the resistors R6 and R7. When there is no input current, little current flows in the feedback resistor Rf. Hence, the potential of the node A is equal to the base-emitter voltage 0.8V of the transistor $Q_1$ of the preamplifier 10. When the ratio between R6 and R7 is set to 1:2, the base potential of the transistor $Q_4$ can be set equal to 1.2V. When the constant-voltage source $V_{CONT2}$ is set equal to 0.8V, the emitter voltage $V_{E4}$ of the transistor $Q_4$ is 0.4V ($V_{E4}$=1.2V−0.8V=0.4V), and the base-emitter voltage of the transistor $Q_3$ is set equal to 0.4V.

Figure 8:
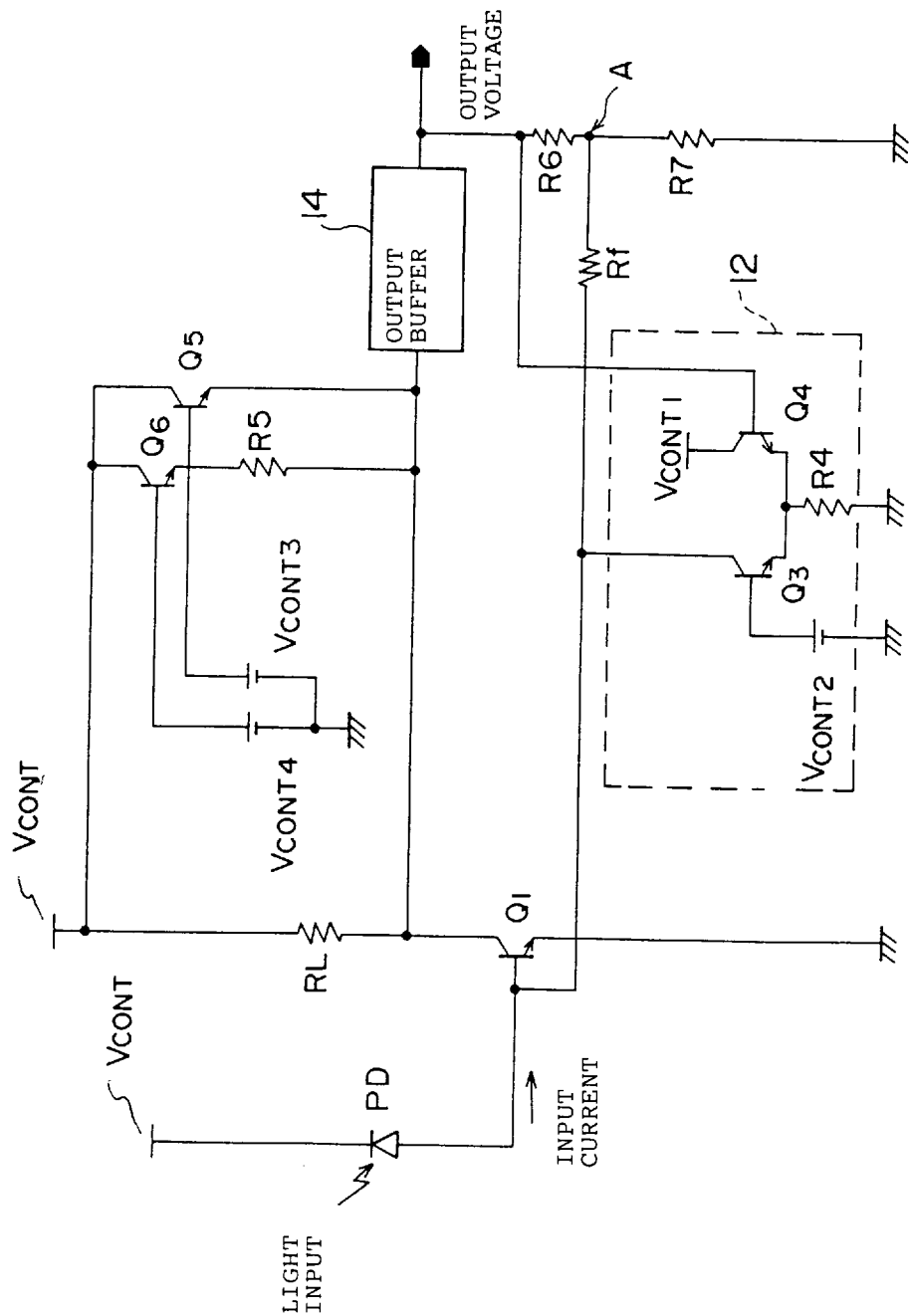
FIG. 8 is a circuit diagram of an amplifier circuit having the combination of the circuit configuration shown in FIG. 7 and that shown in FIG. 5.

FIG. 8 is a circuit diagram of a preamplifier circuit configured by the combination of the circuits shown in FIGS. 5 and 7. It may be said that the preamplifier circuit shown in FIG. 8 corresponds to an expansion of the configuration shown in FIG. 5.

More particularly, a transistor $Q_6$, a resistor R5 and a constant-voltage source $V_{CONT4}$ are provided to the configuration shown in FIG. 5. A phase compensation circuit is formed by the transistors $Q_5$, $Q_6$, the constant-voltage sources $V_{CONT3}$ and $V_{CONT4}$ and the resistor R5. A series circuit of the transistor $Q_6$ and resistor R5 is connected in parallel with the load resistor RL. The transistor $Q_5$ is connected to the load resistor RL in parallel. The base potential of the transistor $Q_6$ is defined by the constant-voltage source $V_{CONT4}$, and the base potential of the transistor $Q_5$ is defined by the constant-voltage source $V_{CONT3}$. The transistors $Q_5$ and $Q_6$ are turned ON at different collector-emitter voltages. That is, the transistors $Q_5$ and $Q_6$ are turned ON at different voltages developing across the load resistor RL. More particularly, when the transistor $Q_6$ is turned ON, the resistor R5 is connected to the load resistor RL in parallel. Then, the transistor $Q_5$ is turned ON. Hence, it is possible to stepwise decrease the differential load resistance RL' according to the amount of the input current and to thus maintain the high-band cutoff frequency $f_{-3dB}$ at a constant level. If the high-band cutoff frequency $f_{-3dB}$ is decreased rapidly, the response speed is decreased so that the circuit does not follow a variation in the light input. However, this problem can be eliminated by maintaining the high-band cutoff frequency $f_{-3dB}$ at a constant level. A detailed description will be given of the phase compensating circuit. The output buffer 14 shown in FIG. 8 corresponds to the transistor $Q_2$ shown in FIG. 5.

Figure 9:
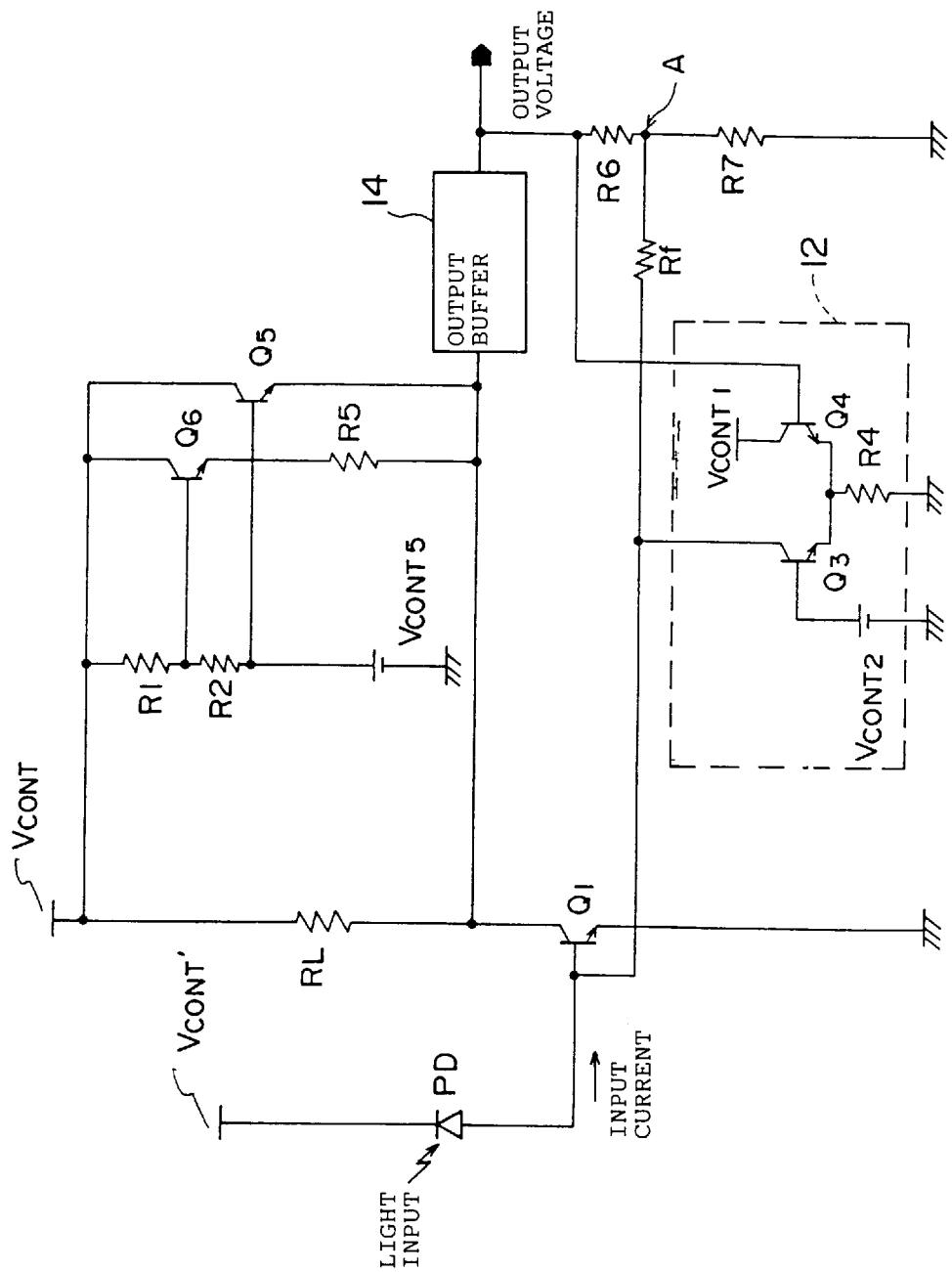
FIG. 9 is a circuit diagram of an amplifier circuit having a variation of a phase compensating circuit shown in FIG. 8.

FIG. 9 is a circuit diagram of a preamplifier circuit including a variation of the phase compensation circuit shown in FIG. 8. A phase compensating circuit shown in FIG. 9 is made up of the transistors $Q_5$ and $Q_6$, the resistors R1 and R2 and a single constant-voltage source $V_{CONT5}$. The constant-voltage source $V_{CONT5}$ is provided between the base of the transistor $Q_5$ and the ground. A series circuit made up of the resistors R1 and R2 is provided between the constant-voltage source $V_{CONT5}$ and the constant-voltage source $V_{CONT}$. The operation shown in FIG. 9 is the same as the operation which has been described previously with reference to FIG. 8.

Figure 10:
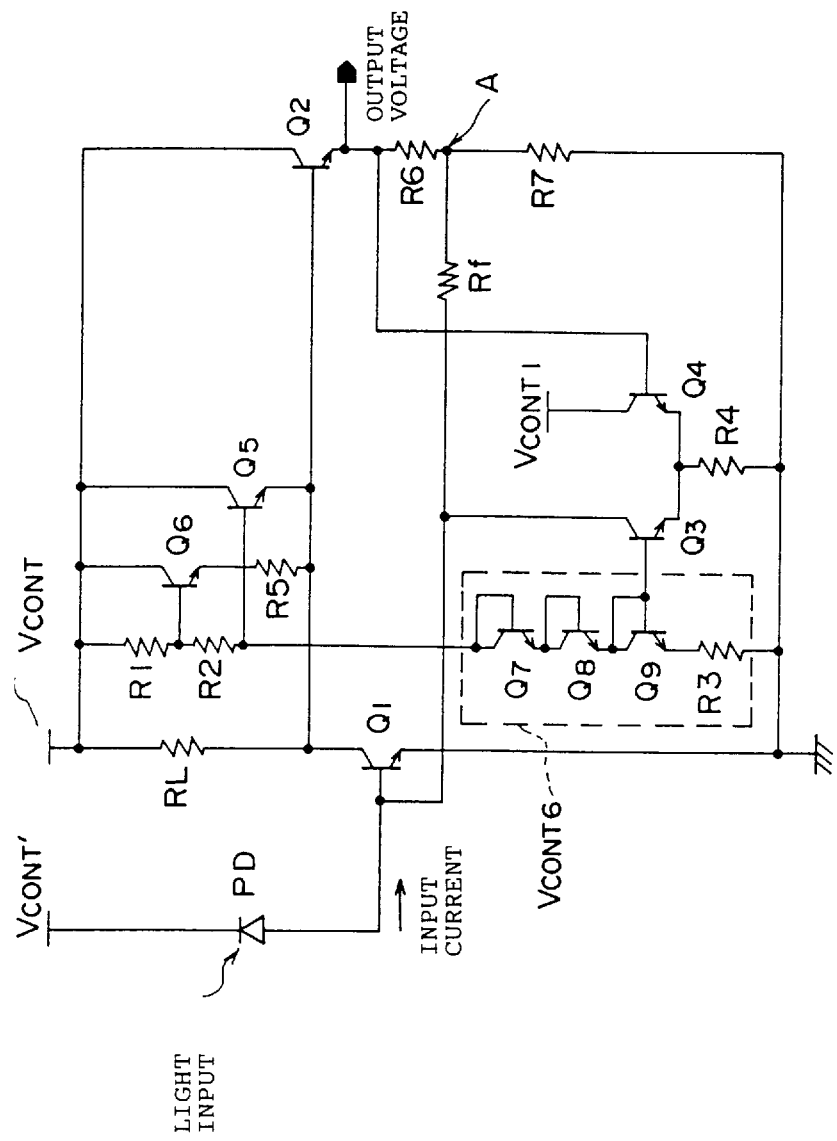
FIG. 10 is a circuit diagram of an amplifier circuit in which two constant-voltage sources shown in FIG. 9 are unified so as to use a single constant-voltage source.

FIG. 10 is a circuit diagram in which the above-mentioned constant-voltage sources $V_{CONT2}$ and $V_{CONT5}$ are unified. More particularly, a constant-voltage source $V_{CONT6}$ has the functions of both the constant-voltage sources $V_{CONT2}$ and $V_{CONT5}$. The constant-voltage source $V_{CONT6}$ includes diode-connected connected transistors $Q_7$, $Q_8$ and $Q_9$ and resistor R3. The transistors $Q_7$, $Q_8$ and $Q_9$ and the resistor R3 are connected in series, and a resultant series circuit is provided between one end of the resistor R2 and the ground.

A description will now be given of the operation of the preamplifier circuit. The circuit is designed so that all the transistors shown in FIG. 10 have a base-emitter voltage of 0.8V and the current bypassing operation is started when an amplitude approximately equal to 0.4V is output at the output terminal of the preamplifier circuit.

When there is no input current, little current flows in the feedback resistor Rf. Hence, the potential of the node A is 0.8V approximately equal to the base-emitter voltage of the transistor $Q_1$. When the ratio of the resistance values of the resistors R6 and R7 is set to 1:2, the base potential of the transistor $Q_4$ is equal to 1.2V. The base potential of the transistor $Q_9$ is always 0.8V. It should be noted that the resistor R3 has a small resistance value and a very small amount of current flows therein. Hence, a voltage drop developing across the resistor R3 is negligible. Hence, when there is no input current, the base-emitter voltage of the transistor $Q_3$ is as small as 0.4V, and the transistor $Q_3$ is OFF. The base potential of the transistor $Q_2$ is equal to 2.0V, and the base potential of the transistor $Q_5$ is equal to 2.4V. Further, the base potential of the transistor $Q_6$ is equal to 2.5V (a current is made to flow in the resistor R2 so that a voltage drop of 0.1V develops across the resistor R2). Hence, the transistors $Q_5$ and $Q_6$ are OFF when there is no input current.

When the current is input which has a magnitude that causes the output voltage to have an amplitude of 0.4V, the base potential of the transistor $Q_4$ becomes equal to 0.8V. Hence, a voltage of 0.8V is ensured as the base-emitter voltage of the transistor $Q_3$, which is then turned ON. Thus, part of the input current is bypassed. Hence, the aforementioned differential transimpedance $Z_{TRAN'}$ is decreased. When the input current has a level which makes the output voltage have an amplitude of 0.4V, the base potential of the transistor $Q_2$ becomes equal to 1.6V. Hence, the base-emitter voltages of the transistors $Q_5$ and $Q_6$ equal to 0.8V are ensured and these transistors are thus turned ON. Thus, the differential load resistance RL' is decreased. As a result, it is possible to gradually decrease the differential transimpedance $Z_{TRAN'}$ from the amount of the input current making the output voltage have an amplitude of 0.4V and to maintain the high-band cutoff frequency $f_{-3dB}$ at a constant level. Thus, a sufficient phase margin can be ensured. Hence, even if the transistors have differences in their characteristics due to a temperature variation or a factor introduced during the production process, the compensating operation is performed so that the transistors $Q_3$, $Q_5$ and $Q_6$ are switched between ON and OFF in response to an identical amount of the input current.

As shown in FIG. 5, if the circuit which decreases the differential load resistance RL' consists of the transistor $Q_5$ only, the high-band cutoff frequency $f_{-3dB}$ cannot be maintained at a constant level because the amount of variation in the differential load resistance RL' with respect to the input current is greater than the amount of variation in the differential transimpedance $Z_{TRAN'}$. With the above in mind, the configuration shown in FIG. 10 is designed to have a phase compensating circuit which has first and second circuit portions. The first circuit portion includes the transistor $Q_6$ and the resistor R5. The transistor $Q_6$ is turned ON even if a small amount of the input current is applied. However, the transistor $Q_6$ does not decrease the differential load resistance RL' down to a level equal to or lower than the resistance value of the resistor R5. The second circuit portion of the phase compensating circuit includes the transistor $Q_5$, which is turned ON when a large amount of the input current is applied. However, the transistor $Q_5$ functions to decrease the differential load resistance RL' greatly. By changing the ratio of the resistance values of the resistors R6 and R7, it is possible to alter the value of the input current which starts to decrease the transimpedance $Z_{TRAN}$.

A case will now be assumed in which the input current becomes zero from an amount which makes the output voltage have an amplitude of 0.4V. In this case, the transistors $Q_3$, $Q_5$ and $Q_6$ are turned OFF from ON in the following way. The transistor $Q_3$ is turned OFF in the following three steps. In the first step, the base potential of the transistor $Q_4$ is increased. In the second step, the emitter potential of the transistor $Q_4$ is increased. In the third step, the transistor $Q_3$ is turned OFF. The transistors $Q_5$ and $Q_6$ are turned OFF in response to an increase in the base potential of the transistor $Q_2$. Hence, it may be roughly said that the transistors $Q_3$, $Q_5$ and $Q_6$ are simultaneously turned OFF. However, more strictly, the switching of the transistor $Q_3$ to OFF lags behind the switching of the transistors $Q_5$ and $Q_6$. Hence, as can be seen from equation (7), the band is transiently extended and the falling can be made more rapidly. Hence, a degradation of the duty ratio can be greatly suppressed.

The circuit configuration shown in FIG. 10, in which the bypass circuit 12 employs the resistor R4, is suitable for a circuit driven by a low power supply voltage. This is because three stages of transistors are provided between the constant-voltage source $V_{CONT}$ and the ground. However, a large amount of current is consumed. For example, when R4=50Ω, a current having an amount of 8 mA is needed to flow in the resistor R4 in order to obtain a voltage of 0.4V developing across the resistor R4.

Figure 11:
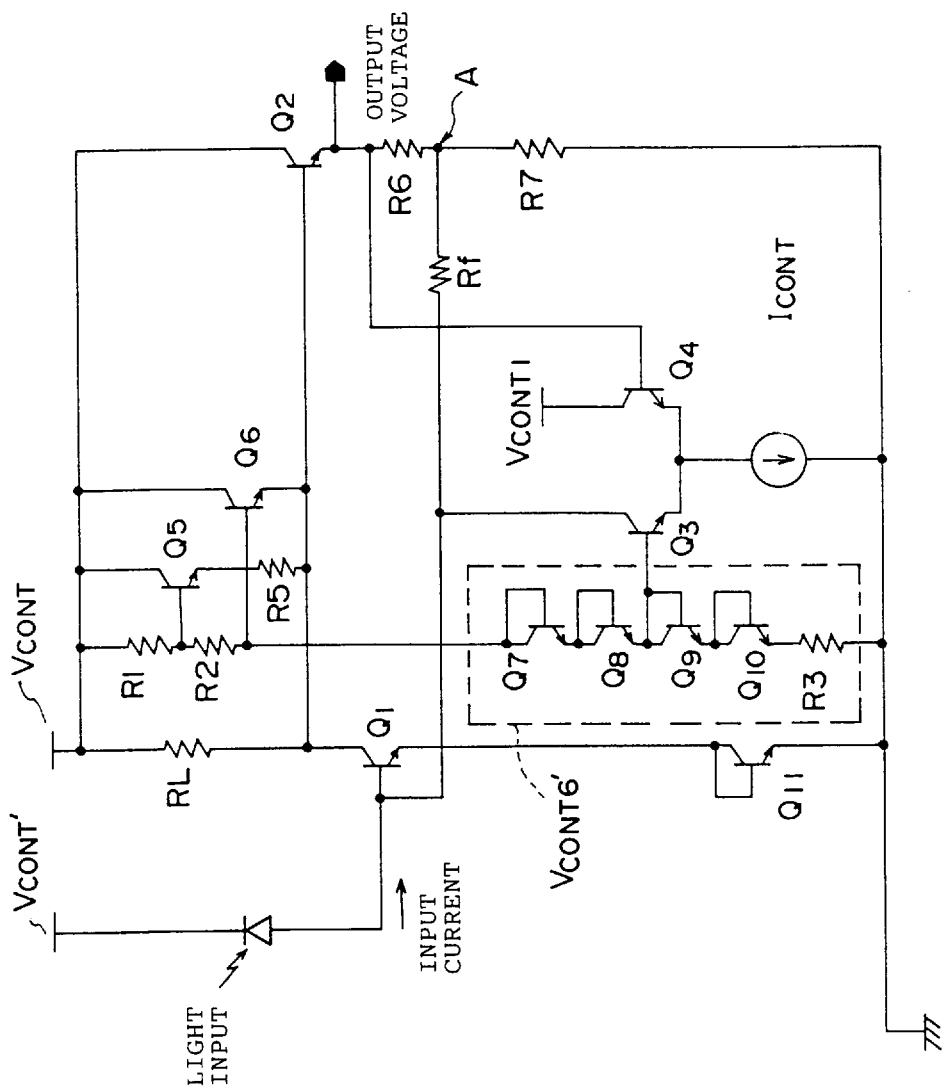
FIG. 11 is a circuit diagram of an amplifier circuit directed to reducing power consumption.

FIG. 11 is a circuit diagram of a preamplifier circuit directed to reducing power consumption. In the preamplifier shown in FIG. 11, a constant-current source $I_{CONT}$ is used instead of the above-mentioned resistor R4. In order to perform the level adjustment by the constant-current source $I_{CONT}$ a transistor $Q_{10}$ is provided to the constant-voltage source $V_{CONT6}$ to thereby form a constant-voltage source $V_{CONT6}$. Further, a transistor $Q_{11}$ with the base connected to the collector is provided between the emitter of the transistor $Q_1$ and the ground. When the constant current is set equal to 1 mA, a current of 1 mA flows in the transistor $Q_4$ when no input current is applied. When a current of 0.5 mA flows in the transistor $Q_3$, a current of 0.5 mA flows in the transistor $Q_4$. Even if the above current values are selected, the circuit shown in FIG. 11 functions in the same manner as the circuit shown in FIG. 10. However, the circuit shown in FIG. 11 needs a higher power supply voltage $V_{CONT}$ than the circuit shown in FIG. 10. Four stages of transistors are provided between the power supply voltage $V_{CONT}$ and the ground.

The present invention is not limited to the specifically disclosed embodiments, and variations and modifications may be made without departing from the scope of the present invention.

What is claimed is:

1. An amplifier circuit, comprising:
   an amplifier which derives an output voltage from an input current: and
   a bypass circuit which bypasses part of the input current so that the remainder of the input current is applied to said amplifier, said bypass circuit further comprising:
   a first transistor having a first terminal connected to a first constant-voltage source, a second terminal connected to a first resistor and a control terminal connected to an output terminal of said amplifier, and
   a second transistor having a first terminal connected to an input terminal of said amplifier, a second terminal connected to said first resistor and a control terminal connected to a second constant-voltage source.

2. An amplifier circuit, comprising:
   an amplifier which derives an output voltage from an input current: and
   a bypass circuit which bypasses part of the input current so that the remainder of the input current is applied to said amplifier, said bypass circuit further comprising:
   a first transistor having a first terminal connected to a first constant-voltage source, a second terminal connected to a first constant-current source and a control terminal connected to an output terminal of said amplifier, and
   a second transistor having a first terminal connected to an input terminal of said amplifier, a second terminal connected to said first constant-current source and a control terminal connected to a second constant-voltage source.

3. The amplifier circuit as claimed in claim 1, wherein said amplifier circuit further comprises:
   a series circuit having a plurality of resistors connected in series between an output terminal of said amplifier and a reference potential point; and
   a feedback resistor connected between an input terminal of said amplifier circuit and a node within said series circuit.

4. The amplifier circuit as claimed in claim 1, wherein said amplifier circuit further comprises:
   a series circuit having a plurality of resistors connected in series between an output terminal of said amplifier and a reference potential point; and
   a feedback resistor connected between an input terminal of said amplifier circuit and a node within said series circuit.

5. An amplifier circuit, comprising:
   an amplifier which derives an output voltage from an input current;
   a bypass circuit which bypassses part of the input current so that the reminder of the input current is applied to said amplifier: and
   a compensating circuit which varies a characteristic of said amplifier by varying a load resistance of a transistor provided in the amplifier on the basis of an amount of the input current.

6. An amplifier circuit comprising:
   an amplifier which derives an output voltage from an input current and comprises a compensating circuit which varies a characteristic of said amplifier on the basis of an amount of the input current;
   a bypass circuit which bypasses part of the input current so that the remainder of the input current is applied to said amplifier: and
   said compensating circuit further comprises:
   a first transistor coupled to a load resistance of a transistor provided in the amplifier in parallel through a second resistor, and a second transistor connected to the load resistance in parallel, and
   the first and second transistors are turned ON at different base potentials.

7. The amplifier circuit as claimed in claim 6, further comprising constant-voltage sources generating different constant voltages, the first and second transistors respectively having bases to which said constant-voltage sources are respectively connected.

8. The amplifier circuit as claimed in claim 6, wherein:
   the first transistor has a base connected to a third constant-voltage source;
   the second transistor has a base coupled to the third constant-voltage source via a third resistor; and
   the third resistor has a base coupled to the fourth constant-voltage source via a fourth resistor.

9. An amplifier circuit comprising:
   an amplifier which derives an output voltage from an input current and comprises a compensating circuit which varies a characteristic of said amplifier on the basis of an amount of the input current;
   a bypass circuit which bypasses part of the input current so that the remainder of the input current is applied to said amplifier, said bypass circuit further comprising:
   a first transistor having a first terminal connected to a first constant-voltage source, a second terminal connected to a first constant-current source and a control terminal connected to an output terminal of said amplifier, and a second transistor having a first terminal connected to an input terminal of said amplifier, a second terminal connected to said first constant-current source and a control terminal connected to a second constant-voltage source; and said compensating circuit further comprises:

a third transistor coupled to a load resistance of a transistor provided in the amplifier in parallel through a second resistor, and a fourth transistor connected to the load resistance in parallel, and the third and fourth transistors are turned ON at different base potentials.

10. The amplifier circuit as claimed in claim 9, further comprising constant-voltage sources generating different constant voltages, the third and fourth transistors respectively having bases to which said constant-voltage sources are respectively connected.

11. The amplifier circuit as claimed in claim 9, wherein:

the fourth transistor has a base connected to a third constant-voltage source;

the third transistor has a base coupled to the third constant-voltage source via a third resistor; and the third resistor has a base coupled to the fourth constant-voltage source via a fourth resistor.

* * * * *